METHOD OF MAKING A DIE FOR STAMPING OUT CIRCUIT BOARDS

Filed May 21, 1971 4 Sheets-Sheet 1

INVENTOR.
WALTER WEGLIN
BY
Graybeal, Cole & Barnard
ATTORNEYS

METHOD OF MAKING A DIE FOR STAMPING OUT CIRCUIT BOARDS
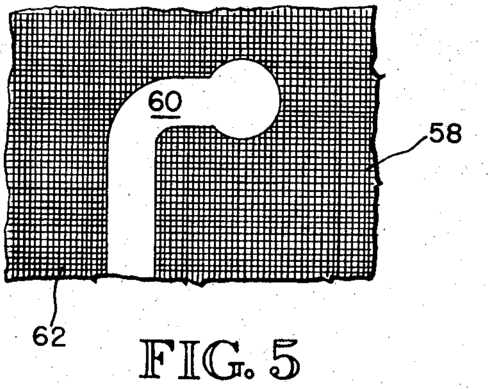
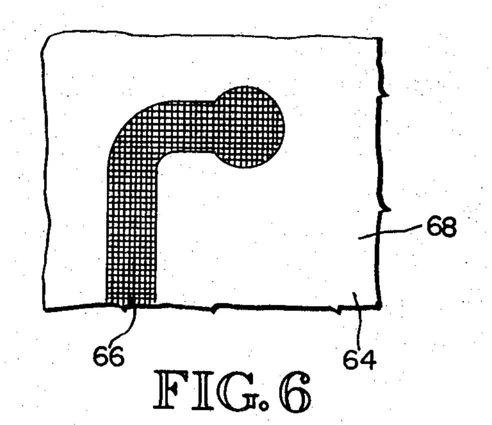
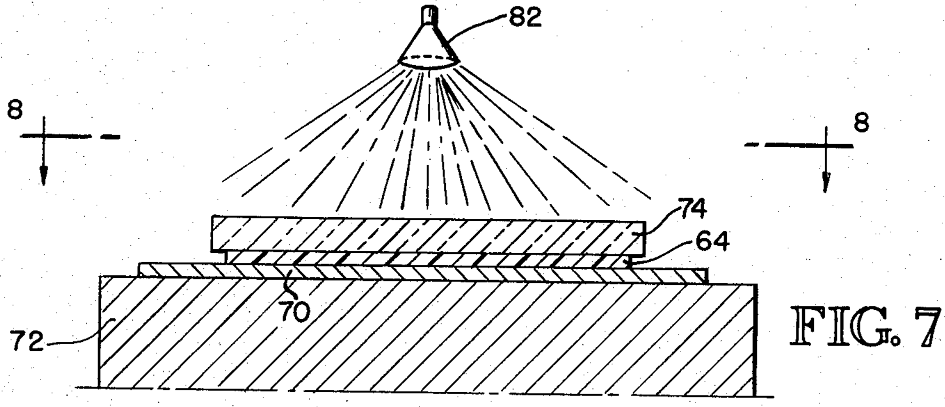
FIG. 7
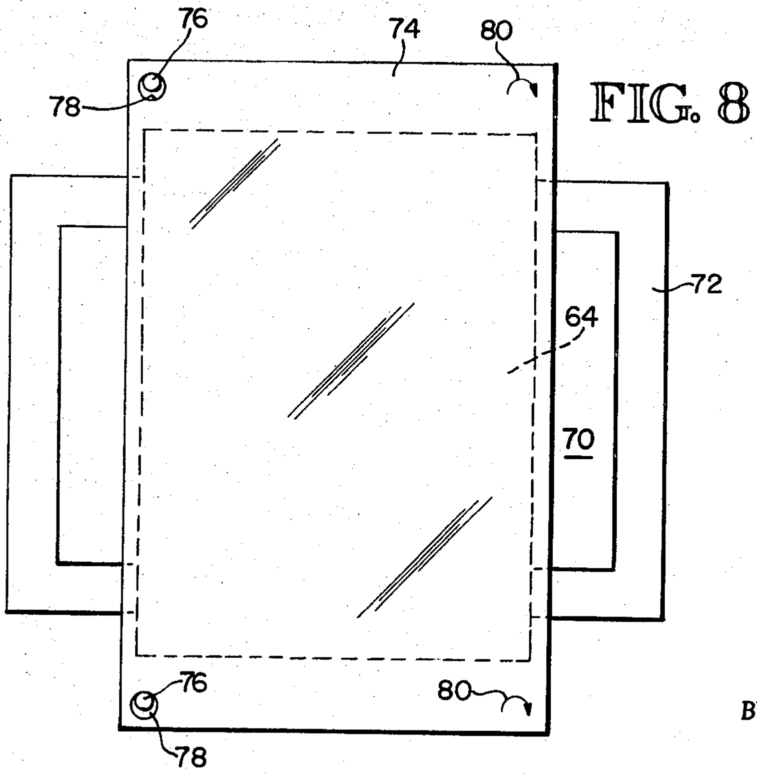
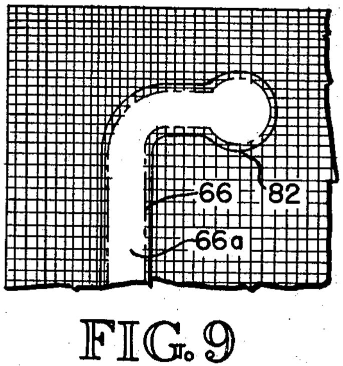
FIG. 9
INVENTOR.
WALTER WEGLIN
BY Graybeal, Cole & Barnard
ATTORNEYS

METHOD OF MAKING A DIE FOR STAMPING OUT CIRCUIT BOARDS

Filed May 21, 1971 4 Sheets-Sheet 3

INVENTOR.
WALTER WEGLIN

BY Graybeal, Cole & Barnard
ATTORNEYS

METHOD OF MAKING A DIE FOR STAMPING OUT CIRCUIT BOARDS

Filed May 21, 1971

INVENTOR.
WALTER WEGLIN
BY Traytread, Cole & Barnard
ATTORNEYS 3,758,350
METHOD OF MAKING A DIE FOR STAMPING OUT CIRCUIT BOARDS

Walter Weglin, Seattle, Wash., assignor to Jerobee Industries, Inc., Redmond, Wash.

Filed May 21, 1971, Ser. No. 145,623
Int. Cl. G03c 5/00
U.S. Cl. 156—8 12 Claims

ABSTRACT OF THE DISCLOSURE

A process of making an improved die for stamping out from a foil sheet circuit board elements onto a substrate. The particular die configuration made by this process is a "modified flat face die," wherein the middle portion of an individual die element is moderately recessed. The process is as follows:

(a) First a conventional flat face die, comprising flat face die elements with intervening recess areas, is formed;

(b) The recess areas are filled with an acid-resisting epoxy, and a photo-resist is applied over the epoxy in a manner to overlap the outer edge portions of the die elements so that the middle portion of each die element is exposed;

(c) The die is placed in an etching solution to form a moderate recess in the middle portion of each die element, with shoulders being formed along the outer portions of each die element;

(d) Then the acid-resist material is removed, and the die surface is again etched for a short period of time;

(e) The epoxy filler is removed.

In a first embodiment, the die is etched the second time only enough to round off the inner edge of each shoulder of the die element to leave flat face shoulder portions on the die element. In a second embodiment, the inner portion of each of the two shoulders is etched away to leave a knife edge at the outer edges of each die element.

To provide the acid-resist coating which overlaps the outer portions of the die elements as described in Step (b) above, an accurate photographic reproduction is made by placing the flat faced die in a developing solution and pressing a fully exposed film against the die. After the film portions exposed to the developing solution are developed, the film is placed in a fix solution to make a photographic reproduction. Then a positive is made from this reproduction and this positive is placed against an unexposed film and light is directed through the positive onto the film. Simultaneously the reproduction is rotated laterally to a very moderate extent while maintaining the same orientation of the reproduction, so that the transparent portions of the reproduction (corresponding to the recess areas of the die) are widened moderately to make a modified reproduction. Then an acid-resist coating corresponding to the transparent areas in this modified pattern is placed on the die face so as to form the photo-resist coating used in Step (b) above.

BACKGROUND OF THE INVENTION

(A) Field of the invention

This invention relates to a method of making an improved die adapted to stamp out from a metal foil a circuit board pattern comprising a plurality of circuit elements on a dielectric substrate.

(B) Description of the prior art

In the prior art it is a common process to etch a pattern onto a plate by applying an acid-resist pattern to the plate surface and then etching the plate surface in the exposed areas. This method has been used in the prior art in making flat faced dies to stamp out from a foil sheet a circuit board pattern onto a substrate.

The prior art shows various modifications of this process. For example, U.S. Pat. No. 3,386,901 issued to L. J. Young, shows a method of modifying the sidewalls of the individual die elements by applying a protective coating to the sidewalls of the die element part way through the etching process.

U.S. Pat. No. 1,709,327, issued to A. H. Spalding et al., shows a similar method wherein protective coatings are applied to the sidewall of the die elements through the etching process, and there is a final etching to round out the recess areas between die elements.

U.S. Pat. No. 3,210,226, to S. Young, Jr., discloses a method of making a tapered etched surface by removing a protective material in a controlled manner as the etching proceeds to make a sloped etched surface.

U.S. Pat. No. 3,204,544, issued to J. A. Shannon, discloses a method of enlarging the width of a line in a printed circuit by moving a negative of the line in a circular pattern, while maintaining the same orientation of the line, while directing light through the negative onto a subjacent photographic film.

Other prior art patents known to the applicant are: U.S. 1,522,899 to A. Miles et al.; U.S. 2,203,849 to A. R. Trist; U.S. 2,507,431 to F. G. Yanes; U.S. 2,925,332 to L .W. Standley; and U.S. 3,340,195 to Borth et al.

SUMMARY OF THE INVENTION

My invention is a method of making a die adapted to stamp out from a foil sheet a circuit board pattern or other pattern, wherein the individual die elements have a recessed center portion and raised edge portions. In a first embodiment my invention makes a die having a particular configuration described in my copending U.S. patent application entitled, "A Circuit Board, Method of Making the Printed Circuit Board and Improved Die for Making Said Board," being filed concurrently with the present patent application. The die has a recessed middle portion, and two outer shoulder portions, each of which has an outer generally right-angled shearing edge and an inner rounded edge portion leading into the recessed portion. In a second embodiment, my invention forms a "knife-edge" die, wherein the middle portion of the die element is recessed, and the edge portions thereof are formed as upstanding sharp edges.

In both embodiments, as an initial step, a conventional flat faced die is formed, with raised flat faced die elements and recessed areas or cavities therebetween. A protective material is then applied to the recess areas and to the outer portions of the individual die elements. This is accomplished by filling the recess areas with an acid-resisting epoxy, and applying a photo-resist over this, with the resist extending over the outer portions of the individual die elements. The die is then etched to recess the exposed middle portions of the die elements. Then the acid-resist material is removed to expose the outer edge portions of the individual die elements.

At this stage, in the first embodiment, the inner edge portion of the raised outer "shoulder" portions of the individual die elements is removed to form a rounded inner edge of the raised shoulder portion of the die elements. This can be accomplished by etching the die for a short period. Thereafter the epoxy is removed from the recess areas of the die.

In the second embodiment, after the resist material is removed to expose the outer raised portion of the individual die elements, etching is continued until an upstanding knife edge is formed at the outer edge of the die element. Thereafter, the epoxy filler in the recess areas of the die is removed.

To provide an acid-resist material which overlaps the outer edge portions of the individual die elements, first an accurate photographic reproduction of the initial flat face die is obtained. This method is described in my copending U.S. patent application, entitled, "Method of Making a Reproduction," being filed concurrently with this present patent application. This method comprises placing the flat faced die in an activating medium, such as a photographic developing solution and pressing a reactive surface such as a fully exposed photographic film against the die face, so that only the film portions corresponding to the recess areas of the die are exposed to the developing solution. Thereafter the film is immediately placed in a fix solution to form a negative of the raised elements. From this negative a positive is made, wherein the areas of the film corresponding to the recess areas of the die are transparent, and those areas corresponding to the die elements are opaque. This positive is placed over an unexposed photographic film, light is transmitted through the positive, and without changing the angular orientation of the positive relative to the underlying film, a circular "wobbling" motion is applied about a very small radius (e.g. .004" to .007") so that the transparent areas on the film corresponding to the recess areas are moderately widened to produce a "modified reproduction." This modified reproduction is then used to provide a resist pattern on the die face which overlaps the outer edges of the die elements.

BRIEF DESCRIPTION OF THE DRAWINGS

FIG. 5 shows a negative made from the method partially illustrated in FIG. 4;

FIG. 6 illustrates a positive made from the negative of FIG. 5;

FIG. 7 is a side elevational view of apparatus used to make a modified reproduction of the positive of FIG. 6;

FIG. 8 is a top plan view taken from the plane 8—8 of FIG. 7;

FIG. 9 is a fragmentary view of a portion of the modified reproduction made by the apparatus shown in FIGS. 7 and 8;

DESCRIPTION OF THE PREFERRED EMBODIMENTS

It is believed that a clearer understanding of the present invention will be obtained by first describing a conventional flat faced die and the character of the modified dies made according to the process of the present invention, and then describing the process of the present invention.

Figure 1:
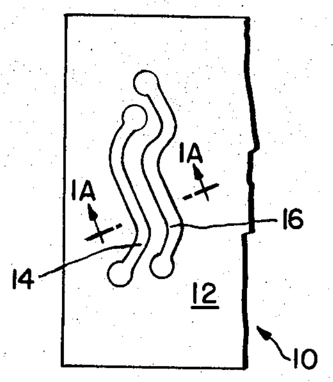
FIG. 1 is a view looking onto a portion of a conventional flat faced die to be processed according to the present invention.

FIG. 1 illustrates a conventional flat faced die which can be used to stamp out a circuit board pattern. This die 10 is a rectangular metal block having a die face 12 on which there are a plurality of die elements, two of which are shown at 14 and 16. Each die element 14 or 16 comprises a flat die face 18 and two sidewalls 20.

Adjacent sidewalls 20 between proximate die elements 18 define a die recess or cavity 22. For purposes of description herein, the various cavities 22 will be referred to collectively as the "cavity area," while the die elements, such as those at 14 and 16, will be collectively referred to as the "die element area."

Figure 2:
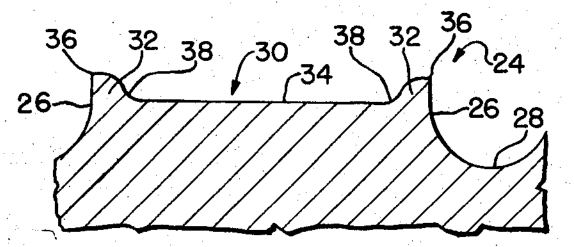
FIG. 2 illustrates a die element of a die made according to the first embodiment of the present invention.

FIG. 2 illustrates a particular die element which results from practicing the process of the first embodiment of the present invention. This die element 24 has two sidewalls 26 which lead into respective cavities or recess areas 28 on opposite sides of the die element 24. The die face 30 of the die element 24 has two raised shoulder portions 32 and a moderately recessed or recessed middle portion 34. Each shoulder portion 32 has a sharply angled outer shearing edge 36 (formed at an approximate right angle) and an inner blunt or rounded edge 38 which slants downwardly and into the middle recessed die face area 34. The characteristics and operation of this particular die element configuration are disclosed in my U.S. patent application entitled, "Circuit Board, Method of Making the Circuit Board and Improved Die for Making Said Board," being filed concurrently with the present patent application.

Figure 3:
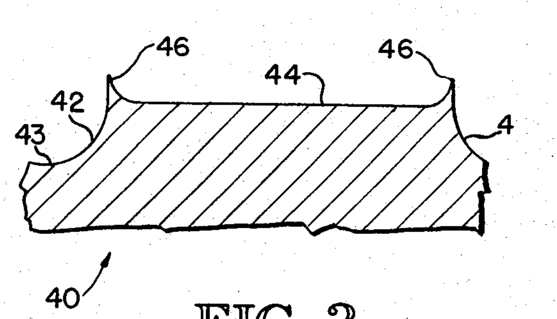
FIG. 3 illustrates a "knife-edge" die made according to a second embodiment of the present invention.

FIG. 3 illustrates a "knife-edge" die, which is made according to the second embodiment of the process of the present invention. This die 40 has two sidewalls 42 which lead into recesses 43 on opposite sides of the die element 40. The face of the die is recessed at 44, and at each edge thereof there is an upstanding knife edge 46.

FIRST EMBODIMENT OF THE PRESENT INVENTION

(a) Providing a flat face die

Figure 1A:
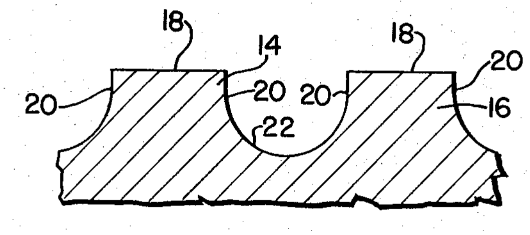
FIG. 1A is a sectional view taken along line 1A—1A of FIG. 1, and showing two die elements of the die of FIG. 1.

The first step of the present invention is to provide a flat face die such as that illustrated in FIGS. 1 and 1A. Since this step is, of itself, known in the prior art, it will be disclosed only briefly herein.

First, a die blank (i.e. a rectangular block of material made of a suitable metal, such as low carbon steel or an air-hardening or oil-hardening steel) is machined to provide a flat face which is to be the die face. This face is cleaned with pumice and water and then etched in a suitable solution (e.g. ferric chloride) to give a roughness to hold a photo-resist material. Then a photo-resist material (e.g., KMER, which is Kodak metal etch resist) is diluted and applied to the die surface in a layer between about .0005 and .001 inch thick. It is air dried for about 10 minutes and then baked in an oven at 250° F. for about a half hour and air cooled. This is done in a partially darkened room.

Next a negative of the die pattern is placed on top of the photo-resist. The transparent portions of the negative correspond to the individual die elements, and are made moderately wider than the actual width of the die element, to allow for moderate undercutting which will occur subsequently when the die blank is placed in an etching solution. To obtain intimate contact between the negative and the photo-resist layer, a glass plate is placed on top of the negative, and a vacuum is applied in a conventional manner to press the glass plate against the negative. An arc lamp is placed about twenty-four inches above the assembly (the die block, the photo-resist layer, negative and glass plate) and this emits radiation on the assembly for about 30 minutes to harden the resist in the exposed areas, which correspond to the die elements to be formed.

The die block with the die pattern on the resist is placed in a resist developing solution for about a minute to wash away the undeveloped areas of the resist, and then is rinsed in water to remove the developer. The result is that there is a thin acid-resist coating covering only the pattern of the die elements (i.e. the die area) which remain raised on the die block.

This die block with the resist pattern thereon is placed in an etching machine which splashes acid onto the die face. This etching is continued for about fifteen to thirty minutes (depending on the etching solution used and the material used for the die block) to etch out the exposed recess areas to a depth of about .015 to .025 inch. Next, the die blank is usually heated or case-hardened. Since there is a certain amount of "undercutting" by the etching solution beneath the photo-resist coating, the die face is ground down a few thousandths of an inch so that the sidewalls 20 of the die elements are substantially perpendicular to the die faces 18 of the die elements. At this point there is produced a conventional flat face die, such as shown in FIGS. 1 and 1A.

It is to be understood that the above processing steps are in and of themselves known in the prior art, and the novelty of the above resides only in its combination with the further steps to be disclosed.

(b) Making an accurate reproduction of the flat face die pattern

Figure 4:
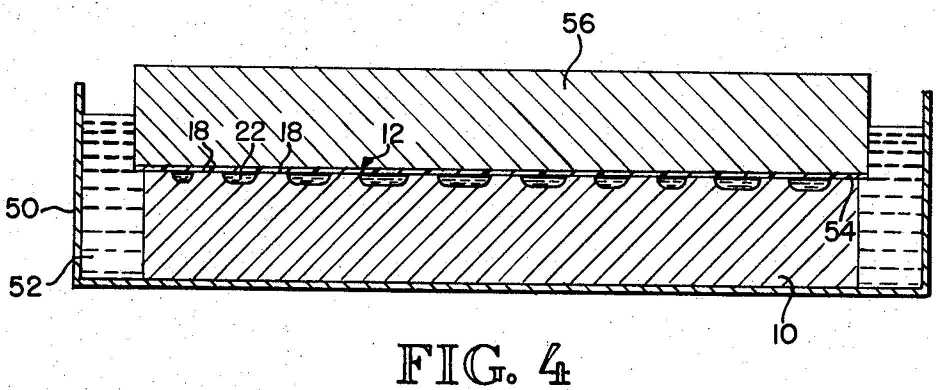
FIG. 4 is a transverse sectional view of apparatus used in making a reproduction of a flat face die.
Figure 10:
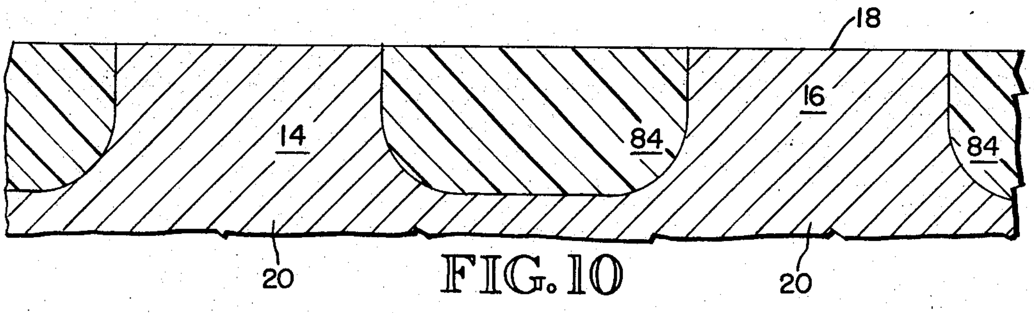
FIGS. 10 through 13 are fragmentary transverse sectional views illustrating the processing steps of the first embodiment of the present invention.

It is to be understood that in making a flat face die by most methods, including the one disclosed above, there will be certain deviations or inaccuracies from the original circuit pattern or die pattern as originally drawn. Hence, this next step is to make a very accurate reproduction of the flat face die as actually made. The manner in which this is accomplished is illustrated in FIGS. 4, 5 and 6.

First, the flat face die 10, made from the processing above, is placed in a shallow container 50 containing a conventional photographic developing solution 52, with the die face 12 facing upwardly. It is essential that the developing solution 52 enter into the various small recess areas 22, so a small syringe emitting a stream of developing solution is used to blow out any occluded air bubbles in the recess areas 22.

Next a fully exposed photographic film 54 is placed against the die face 12. The photographic film 54 is "rolled" onto the die (somewhat in the manner in which a person may apply a sheet of wallpaper) to insure that no air bubbles are caught between the film 54 and the die face 12 so that there is intimate contact between the developing solution 52 in the various recesses 22 and the photographic film 54. The emulsion surface (i.e. the sensitized surface of the film) is the surface that is pressed against the die face 12. Then a plate 56 is pressed against the film to insure proper contact of the film 54 with the surface portions 18 of the various die elements. The film 54 is held in contact for a time sufficient (e.g. one minute) to cause the portions of the film in contact with the developing solution 52 to become developed.

Then the film 54 is removed from the developing solution 52 and immediately rinsed in water to remove the developing solution. Then the film is placed in a fix solution for about two minutes, and the result is a negative that is an accurate reproduction of the die area (the pattern of the various die elements, such as 14 and 16, on the die face 12). A portion of such a reproduction is shown at 58 in FIG. 5, wherein the reproduction 58 has a transparent portion 60 corresponding to a single circuit element, surrounded by an opaque area 62 corresponding to the recess portion surrounding the die element.

Next a positive 64, as shown in FIG. 6, is made from the negative 58 in a conventional manner. In this positive the pattern of the circuit element shown is opaque, as at 66, and the surrounding recess area 68 is transparent.

(c) Making a modified reproduction

The next step is to make a "modified reproduction" wherein the exact reproduction of the various die elements, as obtained in the step immediately above, are reduced in width by an accurately predetermined amount. The manner in which this is done is illustrated in FIGS. 7, 8 and 9.

First an unexposed photographic film 70 is placed on a base plate 72 (this being accomplished in a darkened room), and attached firmly thereto as by tape. Next, positive reproduction 64 (shown in FIG. 6) made by the immediately preceding step is attached firmly to a glass plate 74. The plate 74 with the positive 64 is placed against the film and base 72 so that the positive 64 is against the film 70.

At two corners of the glass plate 74 there are respective rotating shafts 76, each of which has an eccentric 78 located in an accurately matching hole in the plate 74. As the two shafts 76 with their identical eccentrics 78 are rotated in unison, a circular wobbling motion (as illustrated by the arrows at 80 in FIG. 8), is accomplished while the angular orientation of the positive 64 to the film 70 is maintained. As the wobbling motion is imparted to the plate 74, a lamp 82 is turned on to direct radiation through the positive 64 and onto the film 70.

The result of such circular wobbling while exposing the film 70 is to expose the edge portions of the opaque area on the positive 66. As illustrated in FIG. 9, there will be a modified reproduced image 66*a* of the opaque image 66 shown in FIG. 6, reduced in width by an amount which is twice the radius of rotation of the plate 74. To illustrate this, the original image 66, which corresponds precisely to its corresponding die element is shown in dotted lines in FIG. 9. The modified image reproduced is shown at 66*a*. The strip or band lying between the image 66 and 66*a* is designated 82, and can be considered the "overlap area" of the modified reproduction shown in FIG. 9. For the steps to be described hereinafter, the modified reproduction shown in FIG. 9 is transposed into a positive in the same manner that the negative shown in FIG. 5 is transposed in the positive shown in FIG. 6.

(d) Applying resistant filler in relief area

This is accomplished by filling the die cavities 22 with an etch-resistant epoxy filler, such as E-Pox-E glue made by Woodhill Chemical Sales Corporation, of Cleveland, Ohio. The epoxy is applied by hand with a spatula to a level slightly above the die face to permit air bubbles to rise above the die element. After the epoxy is hardened, the epoxy layer is ground down to the level of the surface portions 18 of the die elements 20. The epoxy filler is shown at 84.

Figure 11:
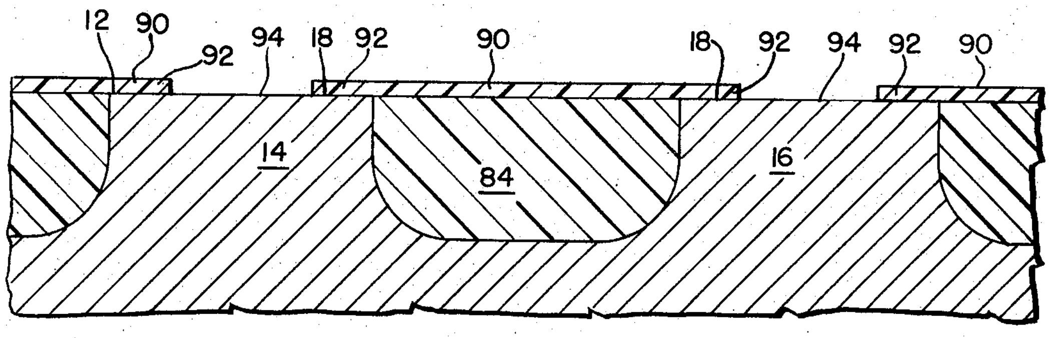

(e) Applying a resist coating corresponding to modified reproduction made according to Step (c) above As indicated in Step (c), a positive is made from the negative shown in FIG. 9, wherein the modified circuit pattern (as at 66*a*) is opaque, and the other portions of the modified reproduction are light transmitting. In this step a resist coating is applied to the die surface 12 whereby the areas such as 66*a* remain unexposed. This is illustrated in FIG. 11.

First, a resist coating is applied to the die face 12 in substantially the same manner as described in Step (a) above. Next, the positive of the modified reproduction produced in Step (c) is placed over the resist coating on the die face 12. The positive is carefully positioned so that the various "skinnied" die element areas, such as 66*a*, are accurately positioned and centered over their corresponding die elements. Thus, around the edge portion of each die element, there will be an exposed edge portion of accurately predetermined width.

With the modified positive so applied to the die face 12, this assembly is exposed to radiant energy to develop the exposed portions of the resist film. The unexposed portions of the resist film are then removed as described in Step (a), and there remains no the die face 12 a resist pattern corresponding to the transparent areas of the modified reproduction produced by Step (c). Thus, with reference to FIG. 11, it can be seen that there is a resist pattern 90 on the die face 12 having overlap portions 92 which reach a moderate distance over the outer edge of each die element face 18. The middle portion of each face 18 remains unprotected as at 94.

(f) Etching exposed middle portions of die elements

The die block with the modified resist pattern placed thereon by the immediately preceding Step (e) is then baked and etched in substantially the same manner as described in Step (a) above. An etching solution is splashed onto the die faces 18 to a depth of between .002 to .006 inch. This can be done by first etching for about 30 to 40 seconds, then inspecting the die face 12 to see if there is any need for touch-up, and then continuing the etching for perhaps three to five minutes, again depending upon the etching solution used and the type of material used for the die block.

Figure 12:
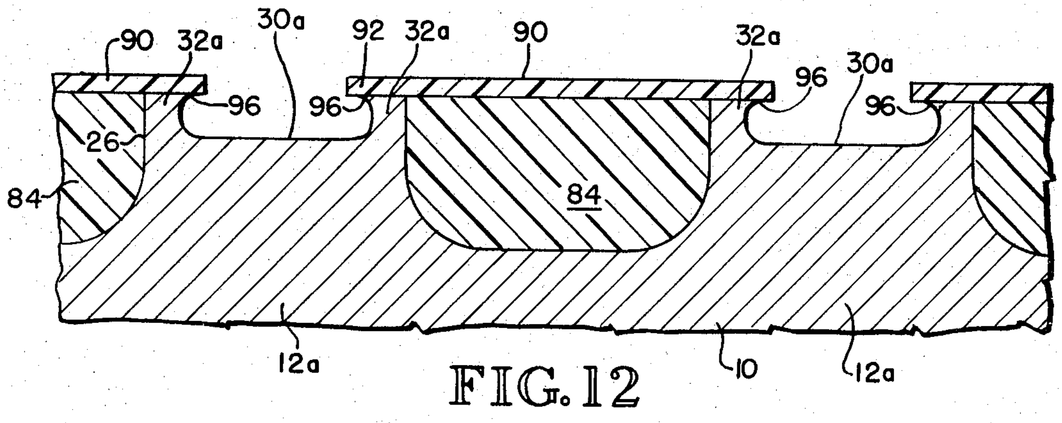
Figure 13:
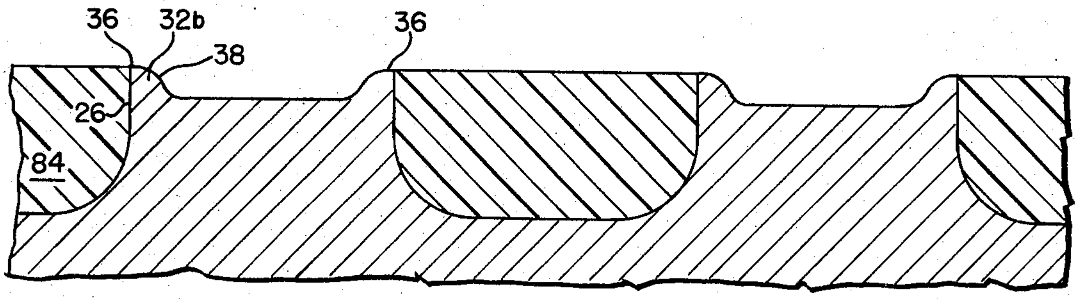

This results in the configuration illustrated in FIG. 12. It will be noted that the individual die element **12*a* now has two shoulder portions 32*a* and a moderately recessed middle portion 30*a***.

(g) Forming rounded inner edge on shoulders of die face

The resist material used in the immediately preceding Step (f) is removed (e.g., by sanding or grinding). Since there is a certain amount of undercutting under the shoulders **32*a* and since a substantially right angle at that point would produce a shear of the copper foil, it is desired to remove the "hook" 96 on the inner edge of each of the shoulder portions 32*a* (as seen in FIG. 12) and provide a positive slope such that the foil will not be sheared. This is conveniently accomplished by placing the die 10 back in the etching solution for about 30 seconds. Since a protruding sharp edge, such as the hook 96, is etched more rapidly when fully exposed to the etching solution, this causes this hook 96 to become rounded off into a rounded inner edge 38, as seen in FIG. 12. It will be noted that the epoxy filler 84 protects the sidewall 26 of the outer edge 36 of the shoulder 32*a*, so that while the surface portion 32*b* is etched away quite moderately (e.g., .001 inch) the sharp right-angled outer edge 36** is maintained.

(h) Removing relief area filler

The die 10 is then heated up to make the epoxy 84 soft, and it is simply scribed out of the various cavities 22 of the recess area of the die 10.

The result is that a die is formed having a plurality of die elements 24, each having the configuration illustrated in FIG. 2.

SECOND EMBODIMENT OF THE INVENTION

Figure 14:
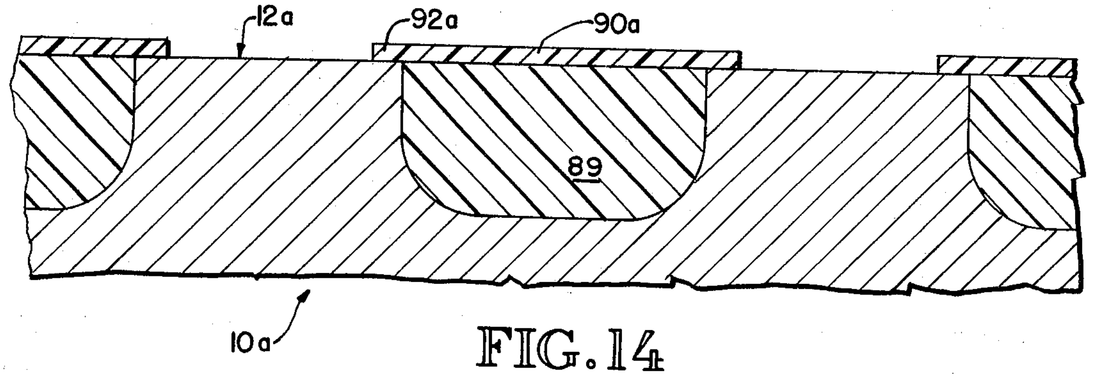
FIGS. 14 through 16 are views similar to FIGS. 10 through 13, but showing the processing steps of the second embodiment of the present invention.
Figure 15:
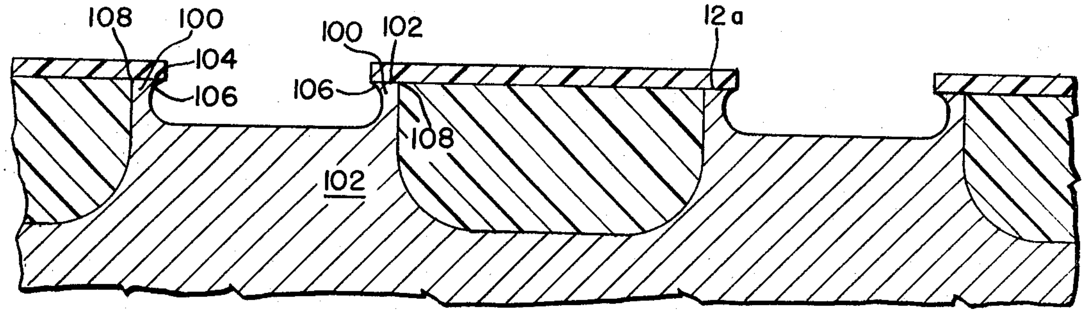
Figure 16:
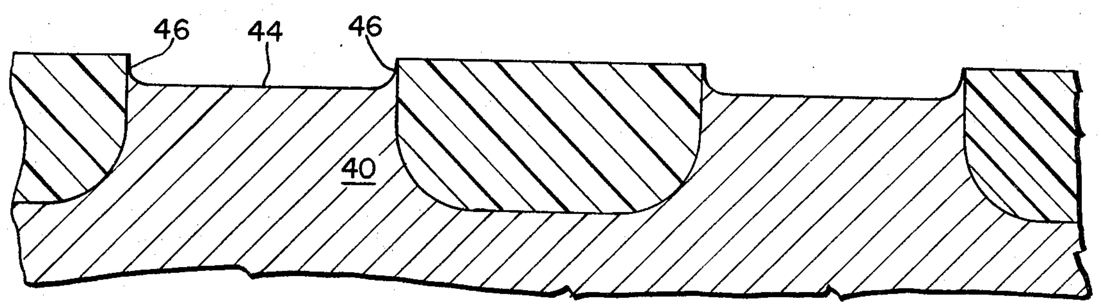

As previously indicated, the second embodiment of the present invention results in making a die having individual die elements, such as the ones shown in FIG. 3. Since the second embodiment is in most respects similar to the first embodiment, it is believed that the second embodiment can be described more clearly simply by noting the differences, with the understanding that the other processing steps are carried out substantially as described previously herein. The second embodiment will be described with references to FIGS. 14, 15 and 16.

The essential difference in the second embodiment is that the modified reproduction of the die pattern is made so that there is a smaller overlap of the modified pattern over the edge portions of the individual die elements. This is specifically accomplished (with reference to FIG. 8) by so sizing the eccentrics 78, that the radius of "wobble" is only about .001 to .003 inch. Thus, the resulting area of overlap (shown at **92*a*** in FIG. 14) is only about .001 to .003 inch wide.

Thus it can be seen (with reference to FIG. 14) that when the die **10*a* with the overlapping resist pattern 90*a* thereon is etched, as in the previous embodiment, two quite narrow shoulders 100 are formed at the edge portions at the individual die element 102. The width of the shoulders 100** would be between about .001 to .003 inch.

Then the resist material is removed so that the shoulders 100 are then exposed at top surfaces 102.

Then the die face **12*a* is exposed to an etching solution for about three to four minutes. The upper inner edge portions 104 of the shoulders 100 are more exposed to the etching solution, while the outer edge 108 still has its sidewall protected by the epoxy filler 89. Thus, the shoulders 100 are etched away to form at the outer edge 108 a knife edge 46 with a recessed middle die portion 44**.

Then the epoxy filler is removed as described in the previous embodiment.

The result is that a die is formed having the individual die elements 40 configured as the knife-edge die element illustrated in FIG. 3.

EXAMPLE NO. 1

A rectangular die block made of low carbon steel, 8 inches long, 6 inches wide, and ¾ inch thick, was cleaned on one of its faces with ferric chloride, scrubbed with pumice and water, water rinsed and air dried. A photo-resist material, Kodak KMER brand, was applied to the die surface. The photo-resist layer was dried for ten minutes and then baked in an oven at 250° F. for 30 minutes and then air cooled. This was done in a slightly darkened room.

A heavied negative of the die pattern, to compensate for undercut from the acid etchant, was placed on top of the photo-resist. A glass plate was placed on top of the negative, and a vacuum applied to press the glass plate against the negative. An arc lamp, about 24 inches above the glass plate was turned on to shine onto the negative for about 30 minutes. The die block with the resist material thereon was placed in a resist-developing solution, KMER Metal Etch Resist Developer, made by Eastman Kodak of Rochester, N.Y., to wash away the undeveloped areas of the resist and then rinsed in water. This provided an acid-resist coating corresponding to the desired pattern of the die elements. The sides and back of the die block were covered with masking tape, and the block was placed in a Master Model PC–32 etching machine, having an etching solution therein which was ferric chloride 35° Baumé (diluted with water from 42° Baumé) etching solution made by Philip A. Hunt Chemical Corp. The plate was etched for 25 minutes to form recess areas between the raised die elements to a depth of about 0.035 inch. The die blank was then case hardened by suspending in a carburizing liquid bath for 7 hours and quenching in caustic cold water. Next the die surface of the die blank was ground with a surface grinding machine for flatness and to remove about 0.003 inch of the material on the die face. The die block was immersed in a photographic developing solution, which was Kodalith Developer made by Eastman Kodak Company. Air bubbles were removed from the recess areas of the die face by means of a syringe emitting a stream of developer solution. A fully exposed photographic film, .004" Type 3 Estar base ortho film by Eastman Kodak Company was placed against the die face, with the emulsion surface of the film contacting the die face. A plate was placed on top of the photographic film to insure proper contact, and the film remained in the developing solution for 1 minute. The film was removed from the developing solution, rinsed in cold water and then immediately placed in a photographic fix solution, which was Rapid Fixer made by Eastman Kodak Company. The film was kept in this fixing solution for two minutes. This resulted in a negative of the die pattern.

A positive was made from the negative, and the positive was placed over an unexposed photographic film, in the manner described previously herein. A circular wobbling was imparted to the plate holding the positive film, with the radius of the circular path being 0.005 inch. An arc lamp placed 48 inches above the film was turned on for ½ minute, and the photographic film was then developed to make a negative of a modified die pattern. A positive was made from this negative.

Then an acid-resist epoxy, E-Pox-E Glue No. EPX–1, made by Woodhill Chemical Sales Corp. was applied to the die surface by hand with a spatula slightly above the die face to permit bubbles to rise above the die element. The die surface was ground to remove the hardened epoxy down to the level of the die elements. The acid-resist coating indicated above was applied to the die face. The positive of the modified pattern was placed over the photo-resist layer, and an arc lamp above the photo-resist layer was turned on to expose the resist. The die, with the developed photo-resist pattern thereon, was placed in a resist developing solution, KMER Metal Etch Resist Developer made by Eastman Kodak, to remove the unexposed areas of the resist.

The die blank with the modified resist pattern thereon was placed in an oven and baked for 30 minutes at 250° F., thereafter placed in a Master etching machine, PC–32 using ferric chloride, 42° Baumé diluted with water to 35° Baumé solution, made by Philip A. Hunt Chemical Corp. The etching was continued for five minutes. The die was removed from the etch solution, and the photo-resist coating was removed by grinding. The die was placed back into the etch solution for 30 seconds to round off the inner corners of the raised portions on the individual die elements. Then the die was placed on a hot plate and heated to 250° to soften the epoxy filler in the recess areas between the die elements, and a scribe was run through recess areas to remove the epoxy therefrom. The result was a die, having individual elements with raised shoulder portions and moderately recessed middle portions in the die elements. The width of the face of the shoulder portions was about 0.005 inch, and the depth of the middle recessed portion of the individual die elements was about 0.005 inch. The configuration of the die elements was substantially as shown in FIG. 2 herein.

EXAMPLE NO. 2

The same process was followed as described in Example 1, except that the radius of rotation to make the modified pattern was 0.003 inch, to produce an overlap of the modified pattern 0.003 inch wide. When the modified resist pattern was applied, the etching was performed as described above to etch into the exposed middle portions of the individual exposed die elements. This left two shoulder portions about 0.001–0.002 inch wide. The photo-resist material was ground off, and the die blank was placed back in the etching machine for two minutes and then removed. The result was that the individual die elements were formed as a knife-edge die as shown in FIG. 3 herein.

The die blank was placed on a hot plate for five minutes to heat it to about 250° F. The epoxy filler was removed from the die with a scribe.

What is claimed is:

1. A method of making a die adapted to form from a foil sheet a circuit pattern having a conducting area comprising at least one conducting element and an insulating area adjacent thereto, said method comprising:
- (a) providing a die having a die face comprising a die area having at least one die element corresponding in shape and location to said circuit conducting element and a recess area adjacent said die element and corresponding to said circuit pattern insulating area,
- (b) applying a protective material over said recess area and over outer face portions of said die element so as to leave unprotected a middle die element face portion between said outer die element face portions, and
- (c) treating with a reagent for removal of material to remove a moderate amount of die material from the exposed die face middle portion so as to form said die element with a recessed middle portion and outer portions raised with respect to said die middle portion.

2. The method as recited in claim 1, comprising the additional step of subsequently removing said protective material from the die element outer face portions and treating with a reagent to remove additional die material from said die element outer face portions.

3. The method as recited in claim 2, wherein a moderate amount of material is removed from said die face outer portions only to round off an inner edge of each of said die face outer portions and leave a relatively flat face shoulder portion at each of said die face outer portions.

4. The method as recited in claim 2, wherein sufficient material is removed from said die face outer portion to provide an upstanding knife edge at an outer edge of each die face outer portion.

5. The method as recited in claim 2, wherein during the die material removing step recited in claim 2, protective material is maintained in said die recess area, whereby a sharply angled edge is maintained at said die face outer edge portions.

6. The method as recited in claim 5, wherein said die face material is removed by etching said die face material.

7. The method as recited in claim 1, wherein said protective material is applied to said die element outer portion by applying said die pattern to a sensitized surface in a manner that the die pattern recess area functions as an activating portion for the sensitized surface and the die element pattern portion acts as a non-activating die pattern portion for the sensitized surface, then moving said die pattern laterally to a moderate extent relative to said sensitized surface so that the activating die pattern portion corresponding to the recess area of the die pattern activates a corresponding portion of the sensitized surface moderately larger than the recess area die pattern portion, to create on said sensitized surface a modified pattern corresponding to said die pattern, but with corresponding recess areas widened and corresponding die element areas narrowed with respect to said die pattern, and providing a protective pattern on said die face corresponding to said modified pattern.

8. A method of making a die adapted to form from a foil sheet a circuit pattern having a conducting area comprising at least one conducting element and an insulating area adjacent thereto, said method comprising:
- (a) providing a die having a die face comprising a die area having at least one die element corresponding in shape and location to said circuit conducting element and a recess area adjacent said die element and corresponding to said circuit pattern insulating area,
- (b) applying a protective material over said recess area and over outer face portions of said die element so as to leave exposed a middle die element face portion between said outer die element face portions,
- (c) performing an etching operation on the exposed middle die element face portion so as to remove material therefrom,
- (d) removing the protective material from said outer face portions of the die element, and
- (e) performing a further etching operation while having protective material in said recess area whereby outer edge portions of said die element have a lateral protective material adjacent thereto.

9. The method as recited in claim 8, wherein there are a plurality of die elements processed according to the steps of claim 8.

10. The method as recited in claim 8, wherein the etching operation recited in Paragraph (e) of claim 8 is carried on only to the extent to remove a moderate amount of material from said outer face portions of the die element so as to round off an inner edge of each of said die face outer portions and leave a relatively flat face shoulder portion at each of said die face outer portions.

11. The method as recited in claim 8, wherein sufficient material is removed in the etching operation recited in Paragraph (e) of claim 8 so as to provide an upstanding knife edge at an outer edge of each die face outer portion.

12. The method as recited in claim 8, wherein the step recited in Paragraph (b) of claim 8 is accomplished by first applying a protective material to the recess area of the die and then applying an acid-resist over at least the outer face portions of the die element.

References Cited

UNITED STATES PATENTS

| | | | |
|---|---|---|---|
| 3,331,726 | 7/1967 | McGinley et al. | 156—510 |
| 3,573,126 | 3/1971 | Kougel | 156—251 |

| | | | |
|---|---|---|---|
| 3,210,226 | 10/1965 | Young, Jr. | 156—11 |
| 3,386,901 | 2/1965 | Young | 156—14 |
| 3,204,544 | 9/1965 | Shannon | 96—38.4 |
| 3,325,285 | 6/1967 | Harris et al. | 96—38 |
| 3,666,479 | 5/1972 | Wiese | 96—38 |

NORMAN G. TORCHIN, Primary Examiner

E. C. KIMLIN, Assistant Examiner

U.S. Cl. X.R.

96—36; 156—14